(12) United States Patent
Torresin et al.

(10) Patent No.: US 12,648,120 B2
(45) Date of Patent: Jun. 2, 2026

(54) VAPOR CHAMBER WITH INTEGRATED BUBBLE PUMP

(71) Applicant: ABB Schweiz AG, Baden (CH)

(72) Inventors: Daniele Torresin, Baden (CH); Andrey Petrov, Zürich (CH); Bruno Agostini, Zürich (CH)

(73) Assignee: ABB Schweiz AG, Baden (CH)

( * ) Notice: Subject to any disclaimer, the term of this patent is extended or adjusted under 35 U.S.C. 154(b) by 306 days.

(21) Appl. No.: 18/612,272

(22) Filed: Mar. 21, 2024

(65) Prior Publication Data

US 2024/0334662 A1 Oct. 3, 2024

(30) Foreign Application Priority Data

Mar. 28, 2023 (EP) ..................................... 23164600

(51) Int. Cl.
*H05K 7/20* (2006.01)
(52) U.S. Cl.
CPC ..... *H05K 7/20936* (2013.01); *H05K 7/20318* (2013.01)
(58) Field of Classification Search
CPC ...... G06F 2200/201; G06F 1/20; G06F 1/206; F28D 15/0233; F28D 15/046; F28D 2021/0028; F28D 15/0266; F28D 15/04; H05K 7/20318; H05K 7/20336; H05K 7/20936; H05K 7/20; H05K 7/20309; H05K 7/20363; H05K 7/20327; F28F 3/12; F28F 2215/06; F28F 3/048; F25B 39/02; F25B 2339/02
USPC ........... 361/700; 165/104.33, 104.26, 104.21
See application file for complete search history.

(56) References Cited

U.S. PATENT DOCUMENTS

| | | | |
|---|---|---|---|
| 3,817,321 A | 6/1974 | Von Cube et al. | |
| 10,746,474 B2 * | 8/2020 | Rosales | F28D 15/025 |
| 11,209,215 B2 * | 12/2021 | Chiriac | F28D 15/025 |
| 12,315,779 B1 * | 5/2025 | Gregory | H10W 40/611 |
| 2017/0010049 A1 | 1/2017 | Agostini et al. | |

(Continued)

FOREIGN PATENT DOCUMENTS

| | | |
|---|---|---|
| EP | 2282624 A1 | 2/2011 |
| JP | 03211372 A | 9/1991 |

(Continued)

OTHER PUBLICATIONS

European Extended Search Report, Application No. 23164600.1, dated Sep. 14, 2023, 8 pps.

*Primary Examiner* — Mandeep S Buttar
(74) *Attorney, Agent, or Firm* — McCarter & English, LLP

(57) ABSTRACT

A vapor chamber for cooling a heat source is provided. The vapor chamber includes a cavity between a baseplate and a condenser wall, the cavity containing a cooling medium, wherein the baseplate has an evaporator side towards the cavity and an attachment side opposite to the evaporator side for attaching the heat source, wherein the baseplate is adapted for transferring heat from the attachment side to the cavity, such that cooling medium evaporates at the evaporator side and condenses at the condenser wall, and wherein the vapor chamber further includes a channel, which is at least partially connected to the baseplate, with an inlet below a liquid level of the cooling medium and an outlet above the liquid level and which provides a bubble pump for transporting the liquid medium from the inlet to the outlet.

14 Claims, 3 Drawing Sheets

(56)         References Cited

U.S. PATENT DOCUMENTS

| 2017/0293329 A1* | 10/2017 | Chiriac | ............... F28D 15/0266 |
| 2018/0270993 A1* | 9/2018 | Kulkarni | ............ H05K 7/20336 |
| 2021/0320048 A1* | 10/2021 | Limaye | ................ H10W 40/73 |
| 2023/0123190 A1* | 4/2023 | Lin | ....................... F28D 15/046 |
| | | | 165/104.26 |
| 2024/0179871 A1* | 5/2024 | Lin | .......................... F28F 3/12 |

FOREIGN PATENT DOCUMENTS

| JP | 2011127868 | A | 6/2011 |
| WO | 2005055319 | A2 | 6/2005 |
| WO | 2015183192 | A1 | 12/2015 |

* cited by examiner

VAPOR CHAMBER WITH INTEGRATED BUBBLE PUMP

CROSS REFERENCE TO RELATED APPLICATIONS

This patent application claims the benefit and priority of European Patent Application No. 23164600.1 filed on Mar. 28, 2023, the disclosure of which is incorporated by reference herein in its entirety as part of the present application.

BACKGROUND

The disclosure relates to a vapor chamber for cooling a heat source, in particular to a power electronics arrangement with such a vapor chamber.

Usually, power electronic modules have to be cooled to keep the temperature of the electronic components, such as power semiconductors, below a maximal operation temperature. For this, a vapor chamber may be used, which contains a working fluid that is circulating inside by means of capillary forces and changing phase between liquid and vapor states, thus ensuring an efficient heat transfer.

However, when the evaporation flow length is too long for the capillary force, a dry-out phenomenon can occur because of liquid deficiency and may result in a too high wall temperature. This too high temperature may decrease significantly the lifetime of the electronic components.

EP 2 282 624 A1 describes a cooling circuit for cooling a heat emitting device, such as power electronics modules, by evaporation of a cooling fluid. The cooling circuit includes evaporation channels. The channels may be transversally so small that the vapor bubbles generated due to the boiling create a bubble pumping effect, with the evaporation bubbles creating a mass flow due to their buoyancy.

JP 2011 127 868 A describes a boiling cooling device, in which a refrigerant evaporates due to a heat source and condenses in a condenser. The device has a refrigerant channel through which refrigerant vapor and bubbles can pass. It is described that foam can form in the channel, which generates a flow of refrigerant vapor through the channel.

BRIEF DESCRIPTION

It is an aspect of the disclosure to improve the cooling performance of a vapor chamber, in particular to reduce the dry-out of a vapor chamber, such as described above.

These aspects are achieved by the subject-matter of the independent claims. Further exemplary embodiments are evident from the dependent claims and the following description.

An aspect of the disclosure relates to a vapor chamber for cooling a heat source, which heat source, for example, may be the chips of a power electronics module, which is attached to the vapor chamber.

According to the disclosure, the vapor chamber includes a cavity between a baseplate and a condenser wall, the cavity containing a cooling medium, wherein the baseplate has an evaporator side towards the cavity and an attachment side opposite to the evaporator side for attaching the heat source and wherein the baseplate is adapted for transferring heat from the attachment side to the cavity, such that cooling medium evaporates at the evaporator side and condenses at the condenser wall.

The cavity may be hermetically sealed. At least a part of the cooling medium may be in liquid form at a bottom of the cavity. When heat is applied to the baseplate, the cooling medium inside the cavity in liquid form is heated and evaporated, in particular at the evaporator side. The cooling medium in vapor form then condenses at the condenser wall, which may be seen as a condenser side.

For example, the cooling medium may be water, ethanol, glycol and/or any other refrigerant, which may be adapted to be evaporated at the temperature, which is generated by the heat source.

At the condenser side and/or condenser wall, a cooling device, such as cooling fins, may be attached to the vapor chamber. The condenser wall is adapted to transfer heat from the cavity to the cooling device.

Opposite to the condenser wall, the heat source, such as a power electronics module, may be attached to the vapor chamber and/or to the baseplate. For this, the baseplate provides the attachment side, which is outside of the cavity. The baseplate is adapted to transfer heat from the attachment side and/or the heat source to the evaporator side and into the cavity.

The condenser wall and the baseplate may be substantially flat members, which are aligned substantially parallel to each other and provide the cavity between them.

According to the disclosure, the vapor chamber further includes a channel, which is at least partially connected to the baseplate, with an inlet below a liquid level of the cooling medium and an outlet above the liquid level and which provides a bubble pump for transporting the liquid medium from the inlet to the outlet. Inside the channel due to heating, vapor bubbles form, which expand and press liquid cooling medium in the channel towards the outlet. The bubbles also may lift the liquid cooling medium, since they have a lower density than the liquid cooling medium. Liquid cooling medium from below the liquid level may be transported through the channel above the liquid level.

The channel may at least partially be a part of the baseplate, such as a hole through the baseplate, or may at least partially be at least outside the baseplate, such as a pipe connected to the baseplate and/or running through the cavity.

In the cavity, liquid cooling medium may collect at the bottom. The outlet of the bubble pump channel may be situated below an average or minimal liquid level that is expected at the bottom during operation of the vapor chamber. For example, the inlet may be an opening in the baseplate. Also the outlet, which also may be an opening in the baseplate, may be situated above the average or minimal liquid level.

It is possible that the channel has more than one inlet and/or more than one outlet. Only the inlets and the outlets are adapted for intaking cooling medium from the cavity or emitting cooling medium into the cavity. The rest of the channel may be closed.

In general, a bubble pump may include a channel, which is adapted for pumping a cooling medium through it with the aid of vapor bubbles, which form due to vaporizing of the cooling medium. The pumping may be realized by the expansion of the bubbles and/or by the buoyancy of the bubbles in the liquid cooling medium.

With the bubble pump, liquid medium inside the vapor chamber may be transported to regions, usually at a top region of the cavity, where a dry-out of the vapor chamber can happen, i.e., where without the bubble pump too less liquid cooling medium is present. Furthermore, with the bubble pump, liquid cooling medium can be transported to hot spots where additional liquid cooling medium may be needed. In summary, the cooling performance of the vapor chamber may be increased.

According to an embodiment of the disclosure, the channel has a diameter and/or shape, such that vapor bubbles of the cooling medium forming in the channel transport liquid cooling medium along the channel. For example, the channel may have a diameter between 50%-150% of an average bubble diameter. In general, the channel parameters, such as diameter and/or cross-sectional shape, may depend on viscosity and surface tension of the liquid cooling medium.

According to the disclosure, the channel is at least partially embedded into the baseplate. For example, a lower section and/or first section providing the inlet may be a through-hole in the baseplate.

According to an embodiment of the disclosure, a channel section having the inlet is embedded into the baseplate. In such a way, heat may be transferred well in this channel section, supporting the forming of bubbles.

According to an embodiment of the disclosure, the channel is completely embedded into the baseplate. In such a way, the inlet and the outlet may be openings in the evaporator side of the baseplate. The complete channel may be a through-hole through the baseplate.

According to an embodiment of the disclosure, a channel section having the outlet is distanced from the baseplate. For example, a channel section inside the baseplate may pass over into a channel section outside of the baseplate, but inside the cavity. This may reduce the heat transfer into the channel, reducing the inflating of the bubbles.

According to an embodiment of the disclosure, the channel section having the outlet is pipe-shaped. A pipe may be an elongated hollow round body with a substantially constant wall thickness. With a pipe-shaped channel section, the outlet may be directed against the baseplate. Liquid cooling medium may be sprayed against the baseplate, in particular in a top region of the baseplate.

According to an embodiment of the disclosure, the baseplate includes pores for receiving the cooling medium and/or the baseplate may be adapted for transporting the cooling medium by capillary forces. Neighboring pores may be interconnected with each other. The baseplate may work as a wick for the liquid cooling medium. A part of the baseplate may be made of a sponge-like and/or fibrous material.

According to an embodiment of the disclosure, wherein a gradient of porosity increases from the attachment side to the evaporation side. For example, a diameter of the pores increases between the attachment side and the evaporator side and/or the density of the pores increases. This facilitates the thermal conduction from the attachment side to the evaporator side, supports evaporation of the cooling medium at the evaporator side and supports the transport of the liquid cooling medium along the baseplate.

According to an embodiment of the disclosure, the baseplate and the condenser wall are aligned in a vertical direction, such that the liquid level in the cavity is transversal to the baseplate and the condenser wall. The liquid cooling medium may collect at a bottom region of the cavity. The baseplate may transport the liquid cooling medium from the bottom region to a top region of the cavity. The cooling medium evaporates into vapor along its way from the bottom region to the top region. At the condenser wall, the vapor may condense and the liquid cooling medium may flow down back to the bottom region.

According to an embodiment of the disclosure, the channel runs at least partially along the vertical direction. The bubble pump channel may transport the liquid cooling medium from the bottom region to the top region of the cavity, where it evaporates. In particular in this arrangement, the bubble pump may transport liquid cooling medium to the top region and may prevent a drying out of the top region.

According to an embodiment of the disclosure, the vapor chamber and/or the baseplate with one or more channels formed as bubble pump is made by additive manufacturing. In particular, the one or more channels may be made in one piece by additive manufacturing.

A further aspect of the disclosure relates to a vapor chamber arrangement, which includes the vapor chamber, such as described herein, and the heat source, such as described herein, connected to the baseplate. For example, the heat source may be glued, soldered and/or screwed to the baseplate.

According to an embodiment of the disclosure, the heat source includes several hot spots and the outlet of the channel is situated at a hot spot. For example, the hot spots may be produced by power semiconductor chips, which during operation and in particular switching generated heat. A hot spot may be an area on the attachment side of the baseplate, where more heat as in other areas is transferred into the baseplate. A hot spot also may form on the evaporator side of the baseplate.

The outlet of a bubble pump channel may be directed towards or above such a hot spot, or may leave the baseplate within or above such a hot spot. In such a way, cooling medium in liquid form may be available at the hot spot.

According to an embodiment of the disclosure, the outlet is outside of the baseplate and is directed towards a hot spot. When the section of a bubble bump channel with the outlet is outside of the baseplate, the outlet may be used as orifice for spraying cooling medium onto the hot spot or above the hot spot.

According to an embodiment of the disclosure, a channel section of the channel providing the bubble pump is arranged besides the hot spots and/or runs outside of hot spots. They reduce the heat transfer performance of the baseplate at the hot spots, the one or more channels may be guided around the hot spots, at least partially. The one or more channels may be arranged substantially in regions outside the hot spots.

According to an embodiment of the disclosure, the vapor chamber includes at least two channels providing a bubble pump. These bubble pump channels may run from a bottom region of the cavity to a top region of the cavity. The channels may be aligned substantially parallel.

According to an embodiment of the disclosure, the outlets of the channels are situated at different hot spots. Each bubble pump channel may be used for supplying cooling medium to a dedicated hot spot. In such a way, specific hot spots may be better cooled individually.

According to an embodiment of the disclosure, the vapor chamber arrangement is a power electronics arrangement. The heat source may be a power electronics module connected to the baseplate of the vapor chamber and/or the hot spots are generated by power semiconductor chips. Specific power semiconductor chips may be better cooled individually by directing an outlet of a bubble pump channel to the corresponding hot spot.

These and other aspects of the disclosure will be apparent from and elucidated with reference to the embodiments described hereinafter.

BRIEF DESCRIPTION OF THE DRAWINGS

The subject-matter of the disclosure will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION

Figure 1:
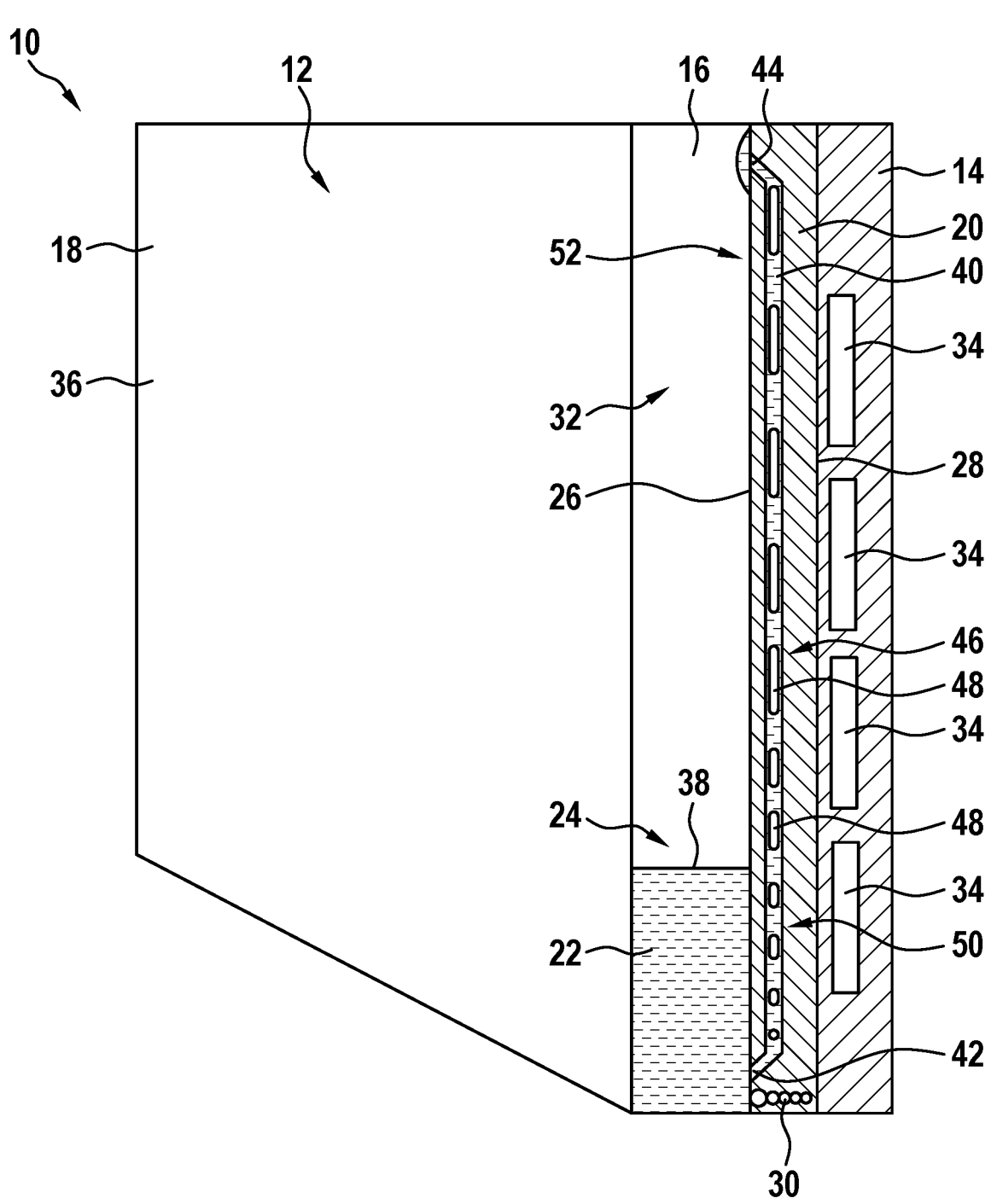
FIG. 1 schematically shows a cross-section of a vapor chamber arrangement according to an embodiment of the disclosure.

FIG. 1 shows a vapor chamber arrangement 10 including a vapor chamber 12 and a power electronics module 14, which in general may be a heat source 14.

The vapor chamber 12 includes a hermetically sealed cavity 16, which is limited by a condenser wall 18 and a baseplate 20. Inside the cavity 16, which also may be seen as an evaporator, a cooling medium 22 is present in liquid and gaseous form, i.e., vapor. Liquid cooling medium 22 collects in a bottom region 24 of the cavity 16.

The baseplate 20 includes an evaporator side 26 and an attachment side 28. The baseplate 20 is made of a thermally conducting material, such as metal. Also, the other components of the vapor chamber, such as the condenser wall 18, may be made of metal.

The baseplate 20 may be porous, i.e., may contain pores 30. Some of the pores 30 are indicated at the bottom of the baseplate 20, however, the complete baseplate 20 may include pores 30. Due to the pores 30, the baseplate 20 acts as a wick and the liquid cooling medium 22 from the bottom region 24 is transported by capillary forces towards a top region 32 of the cavity 16.

The heat source 14 is attached to the attachment side 28 of the baseplate 20. During operation, the power electronics module 14 generates heat, in particular via power electronics chips 34, which due to their internal resistance convert some of the processed electric power into heat. The heat from the power electronics module 14 is transported by the baseplate 20 from the attachment side 28 to the evaporator side 26. There and possibly inside the baseplate 20, in particular inside the pores 30, the liquid cooling medium is heated and evaporates into vapor, which vapor, i.e., gaseous cooling medium 22, collects above the liquid cooling medium 22 inside the cavity 16.

A gradient of porosity of the baseplate 20, i.e., the density and/or diameter of the pores 30, may increase from the attachment side 28 to the evaporation side 26. This may support the transfer of heat through the baseplate 20 vertically to the liquid cooling medium transport, and/or the evaporation of the cooling medium 22 at the evaporator side 26.

The baseplate 20 may have a gradient of increasing porosity from the heat source 14 and/or power electronics module 14 to the liquid cooling medium 22 and/or the cavity 16. The heat source 14 and/or power electronics module 14 may be thermally connected to the denser side of the baseplate 20.

The vapor condenses at the condenser wall 18 and runs down the condenser wall 18 towards the bottom region 24, where the condensed cooling medium 22 collects.

The condenser wall 18 may be made of a thermally conducting material, such as metal.

In summary, the baseplate 20 has an evaporator side 26 towards the cavity 16 and an attachment side 28 opposite to the evaporator side 26 for attaching the heat source 14, wherein the baseplate 20 is adapted for transferring heat from the attachment side 28 to the cavity 16, such that cooling medium 22 evaporates at the evaporator side 26 and condenses at the condenser wall 18.

A liquid level 38 separates the liquid cooling medium 22 and the vapor, i.e., gaseous cooling medium 22. The baseplate 20 and the condenser wall 18 may be aligned in a vertical direction, such that a liquid level in the cavity 16 is transversal to the baseplate 20 and the condenser wall 18.

The vapor chamber 12 further includes a channel 40, with an inlet 42 below a liquid level 38 of the cooling medium 22 and an outlet 44 above the liquid level 38. The channel 40 with the inlet 42 and the outlet 44 provides a bubble pump 46 for transporting the liquid medium 22 from the inlet 42 to the outlet 44. In other words, a bubble pump 46 is integrated into the vapor chamber 12.

The bubble pump 46 is designed to bring additional liquid cooling medium 22 to the top region 32 and in particular to hot spots situated in the top region 32 of the vapor chamber 12. This may reduce or solve the problem of insufficient capillary porous liquid flow in the baseplate 20 leading to dry-out. The bubble pump 46 is adapted to bring liquid cooling medium 22 to a liquid deficient region in the top region 32 of the vapor chamber 12.

The channel 40 of the bubble pump 46 has a diameter, such that vapor bubbles 48 of the cooling medium 22 forming in the channel 40 transport liquid cooling medium 22 along the channel 40. The bubble pump 46 is designed to lift liquid cooling medium 22 to the top region 32 of the cavity 16 by means of confined bubbles 48 that grow only in the flow direction by heat absorption.

The channel 40 may run at least partially along the vertical direction, which may support the transportation of the liquid cooling medium 22 due to the lower density of the bubbles 48. However, it is also possible that solely the expansion of the bubbles 48 is used for transporting the liquid cooling medium 22 in horizontal sections of the channel 40.

The inlet 42, which connects the channel 40 to an evaporator liquid pool, i.e., the liquid cooling medium 22 at the bottom, may be situated below a minimal liquid level 38, i.e., the lowest possible liquid level 38.

The outlet 44, which connects the channel 40 to a vapor space, i.e., a space without liquid cooling medium 22 in the cavity 16 in the top region 32, may be situated above a maximal liquid level 38, i.e., the highest possible liquid level 38.

As shown in FIG. 1, the channel 40 may be completely embedded into the baseplate 20, for example may be a through-hole through the baseplate 20. However, in general, the channel 40 may be solely partially embedded into the baseplate 20.

Alternatively, the channel 40 may be pipe-shaped and solely may be connected to the baseplate 20.

Figure 2:
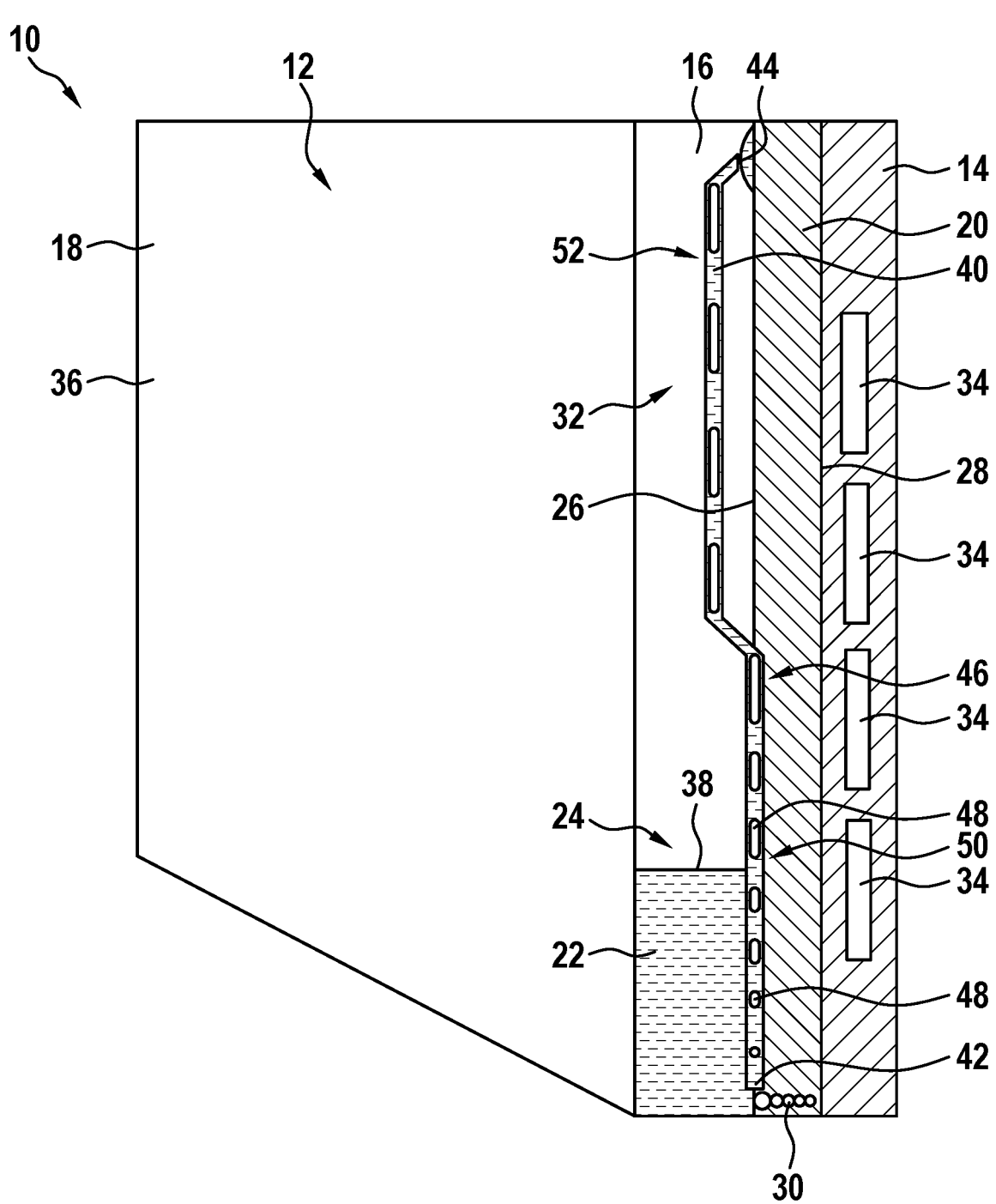
FIG. 2 schematically shows a cross-section of a vapor chamber arrangement according to a further embodiment of the disclosure.

FIG. 2 shows a further embodiment of a vapor chamber 12, where a channel section 50 having the inlet 42 is partially embedded into the baseplate 20 and a channel section 52 having the outlet 44 is distanced from the baseplate 20. The bubble pump 46 and/or the channel 40 is semi-embedded.

Thus, the channel 40 is at least partially connected to the baseplate 20 and is partially embedded into the baseplate 20.

It is also possible that the channel section 50 having the inlet 42 is completely embedded into the baseplate 20. In general, a lower fraction of the bubble pump channel 40 is partially or totally embedded into the baseplate 20, in order to ensure the minimal amount of heat transfer required to sufficiently grow the bubbles 48 and thus lift enough liquid cooling medium 22.

The channel section 52 having the outlet 44 is distanced from the baseplate 20. For example, the channel section 52 having the outlet 44 may be pipe-shaped. In general, an upper fraction of the bubble pump channel 40 is partially situated in the cavity 16 and is not in contact with the baseplate 20 in order to stop the bubble growth and make sure that there is enough liquid cooling medium 22 left at the outlet 44 of the channel 40.

Figure 3:
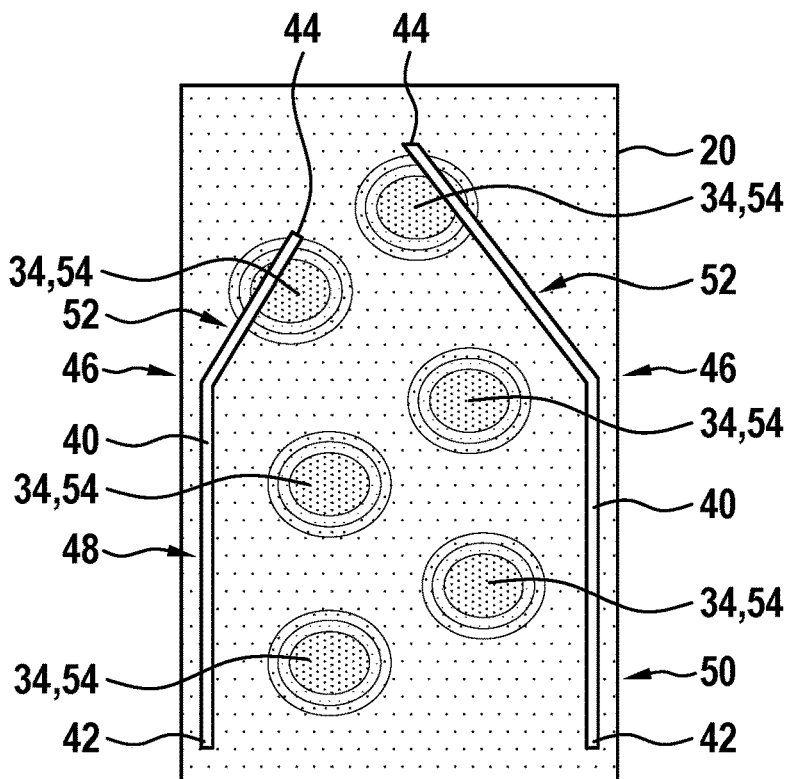
FIG. 3 shows a schematic view onto a baseplate of a vapor chamber arrangement according to a further embodiment of the disclosure.

FIG. 3 shows a schematic view onto the baseplate 20, for example onto the evaporator side 26. It can be seen that there can be more than one bubble pump 46 and/or more than one channel 40. The vapor chamber 12 may include at least two channels 40 providing a bubble pump 46. The number of bubble pumps 46 and/or channels 40 and/or outlets may depend on the number of dry spots to wet with liquid cooling medium 22.

As shown in FIG. 3, the heat source 14 may include and/or generate several hot spots 54, which have a higher temperature as other parts of the heat source 14. For example, the heat source 14 is a power electronics module 14 connected to the baseplate 20 of the vapor chamber 12 and the hot spots 54 are generated by power semiconductor chips 34. A hot spot 54 may be an area of the evaporator side 26 with a higher temperature as other areas of the evaporator side 26.

The one or more outlets 44 of the one or more channels 40 may be arranged, such that they are situated at different hot spots 54. In particular, an outlet 44 may be situated at each hot spot 54 in a top region 32 of the vapor chamber 12.

For example, as shown in FIG. 2, an outlet 44 may be situated outside of the baseplate 20 and may be directed towards a hot spot 54 and/or may end above a hot spot 54. In such way, liquid cooling medium 22 may be sprayed onto a hot spot 54 and/or may wet a hot spot 54 directly.

Furthermore, the one or more bubble pumps 46 and/or their channels 40 may be arranged according to a flux density map of the heat source 14 and in particular to the arrangement of hot spots 54. For example, a channel section 50 of the channel 40 providing the bubble pump 46 may be arranged besides the hot spots 54 and/or run outside of hot spots 54. In particular, a fraction of the one or more channels 40, such as the section 50, that is in contact with the baseplate 20 and/or embedded into the baseplate 20 may be placed besides the hot spots 54, so that it still receives heat by conduction but do not hinder the capillary cooling of the lower hot spots 54, i.e., hot spots in the bottom region 24.

A fraction of the one or more channels 40 that is in a vapor space of the cavity 16, such as the section 52, may have the outlet 44 right above a hot spot 54, so that the liquid cooling medium 22 flowing out of the channel 40 may directly wet this hot spot 54.

The components of the vapor chamber 12, in particular, the cavity 16, the condenser wall 18, the baseplate 20, may be the fins 36 and the channel 40, may be made using additive manufacturing.

Figure 4:
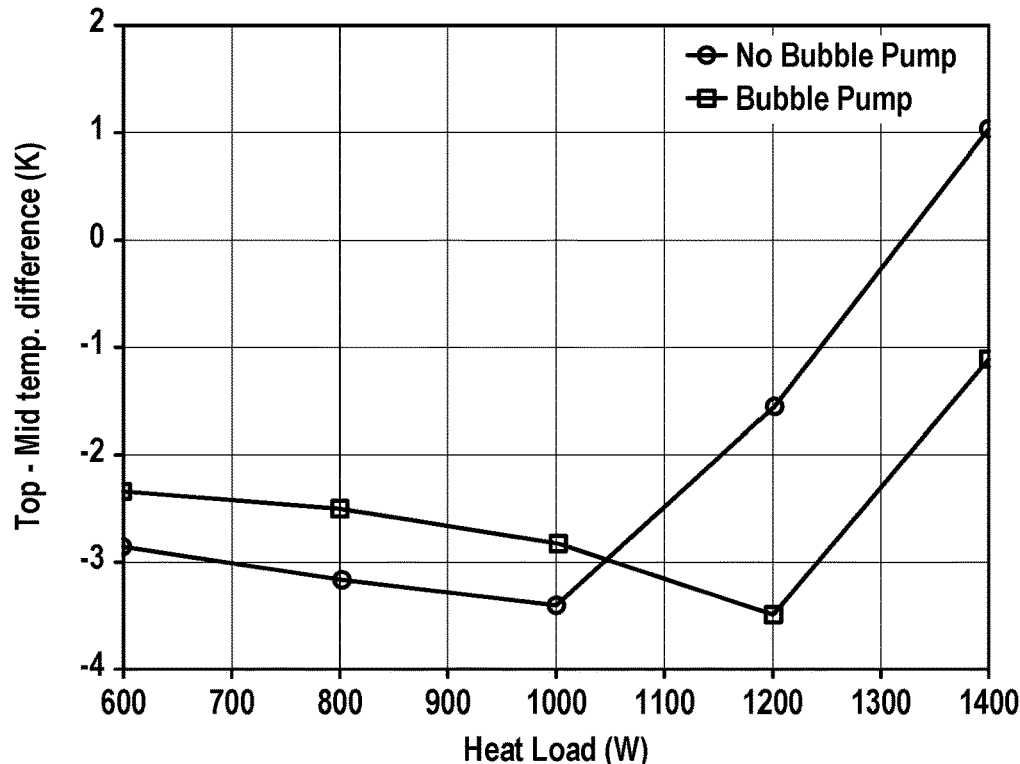
FIG. 4 shows a diagram comparing the performance of a vapor chamber with and without a bubble pump channel.

FIG. 4 shows the temperature difference between a top and a middle of the cavity 16. In absence of dry-out, the middle of the cavity 16 would be the hottest point of the vapor chamber 12. However, when dry-out occurs, the top becomes the hottest part. Therefore, plotting measurements of this temperature difference allows to characterize a dry-out. FIG. 4 shows that using a bubble pump 46 with two channels 40, such as described with respect to FIGS. 1-3, allows to delay a dry-out by about 200 W.

While the disclosure has been illustrated and described in detail in the drawings and foregoing description, such illustration and description are to be considered illustrative or exemplary and not restrictive; the disclosure is not limited to the disclosed embodiments. Other variations to the disclosed embodiments can be understood and effected by those skilled in the art and practicing the claimed disclosure, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

What is claimed is:

1. A vapor chamber for cooling a heat source,
wherein the vapor chamber comprises a cavity between a baseplate and a condenser wall, the cavity containing a cooling medium;
wherein the baseplate has an evaporator side towards the cavity and an attachment side opposite to the evaporator side for attaching the heat source;
wherein the baseplate is adapted for transferring heat from the attachment side to the cavity, such that cooling medium evaporates at the evaporator side and condenses at the condenser wall;
wherein the vapor chamber further comprises a channel, the channel is at least partially connected to the baseplate, and with an inlet of the channel below a liquid level of the cooling medium and an outlet of the channel above the liquid level, the channel provides a bubble pump configured to transport the cooling medium from the inlet to the outlet; and
wherein the channel is at least partially embedded into the baseplate.

2. The vapor chamber of claim 1,
wherein the channel has a diameter, such that vapor bubbles of the cooling medium forming in the channel transport liquid cooling medium along the channel.

3. The vapor chamber of claim 1,
wherein a channel section having the inlet is embedded into the baseplate.

4. The vapor chamber of claim 1,
wherein the channel is completely embedded into the baseplate.

5. The vapor chamber of claim 1,
wherein a channel section having the outlet is distanced from the baseplate; or
wherein the channel section having the outlet is pipe-shaped; or
wherein a channel section having the outlet is distanced from the baseplate and is pipe-shaped.

6. The vapor chamber of claim 1,
wherein the baseplate comprises pores sized to receive the cooling medium and adapted to transport the cooling medium by capillary forces.

7. The vapor chamber of claim 6,
wherein a gradient of porosity increases from the attachment side to the evaporation side.

8. The vapor chamber of claim 1, wherein the baseplate and the condenser wall are aligned in a vertical direction, such that the liquid level in the cavity is transversal to the baseplate and the condenser wall; and wherein the channel runs at least partially along the vertical direction.

9. The vapor chamber of claim 1, wherein the vapor chamber and/or the baseplate with one or more channels formed as bubble pump is made by additive manufacturing.

10. A vapor chamber arrangement, comprising:

the vapor chamber according to claim 1, wherein the baseplate is connected to the heat source; and wherein the heat source includes several hot spots and the outlet of the channel is situated at a hot spot.

11. The vapor chamber arrangement of claim 10, wherein the outlet is outside of the baseplate and is directed towards at least one of the hot spots.

12. The vapor chamber arrangement of claim 10, wherein a channel section of the channel providing the bubble pump is arranged besides the hot spots and/or runs outside of the hot spots.

13. The vapor chamber arrangement of claim 10, wherein the vapor chamber comprises at least two channels providing the bubble pump; and wherein outlets of the at least two channels are situated at different hot spots.

14. The vapor chamber arrangement of claim 10, being a power electronics arrangement, wherein the heat source is a power electronics module connected to the baseplate of the vapor chamber; and wherein the hot spots are generated by power semiconductor chips.

* * * * *